United States Patent [19]

Kausche et al.

[11] Patent Number: 4,492,813
[45] Date of Patent: Jan. 8, 1985

[54] AMORPHOUS SILICON SOLAR CELL

[75] Inventors: Helmold Kausche; Matthias Moeller; Franz Fischer, all of Munich, Fed. Rep. of Germany

[73] Assignee: Siemens Aktiengesellschaft, Berlin & Munich, Fed. Rep. of Germany

[21] Appl. No.: 524,438

[22] Filed: Aug. 18, 1983

[30] Foreign Application Priority Data

Nov. 19, 1982 [DE] Fed. Rep. of Germany ....... 3242835

[51] Int. Cl.³ ............................................. H01L 31/04
[52] U.S. Cl. .................................... 136/256; 136/258; 357/30; 357/65; 204/192 C; 427/91
[58] Field of Search ............... 136/256, 258 AM, 259, 136/258 PC; 204/192 C; 427/74, 90, 91; 357/30, 65

[56] References Cited

U.S. PATENT DOCUMENTS 3,914,856 10/1975 Fang ....................................... 29/572

FOREIGN PATENT DOCUMENTS 3023165 1/1982 Fed. Rep. of Germany ...... 136/259

OTHER PUBLICATIONS

Y. Uchida et al., "Conversion Efficiency of Large Area a-Si:H Solar Cell", Conference Proceedings, Fifteenth IEEE Photovoltaic Specialist Conference, Florida (1981), pp. 922–927.

Primary Examiner—Aaron Weisstuch
Attorney, Agent, or Firm—Hill, Van Santen, Steadman & Simpson

[57] ABSTRACT

Solar cells having a semiconductor body composed of amorphous silicon which is applied to a substrate coated at least at one surface thereof with aluminum, functioning as a back contact. Recrystallization is prevented by alloying silicon or silicon/titanium into the aluminum layer so that the amounts of silicon within the alloy is, in preferred embodiments, about 1.3% by weight and, with the presence of 0.1% by weight titanium, is at about 1.2% by weight.

6 Claims, 1 Drawing Figure

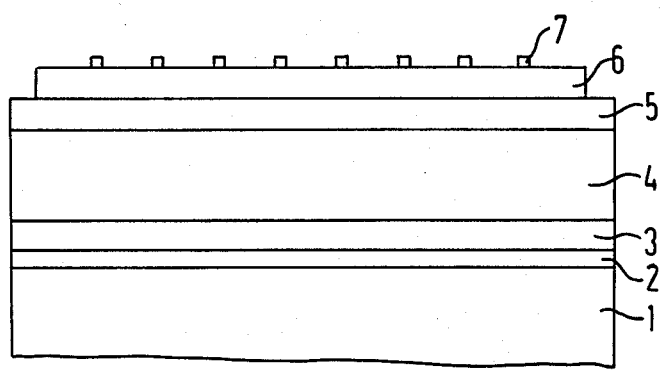

AMORPHOUS SILICON SOLAR CELL

BACKGROUND OF THE INVENTION

1. Field of the Invention

The invention relates to solar cells and somewhat more particularly to solar cells having a semiconductor body formed of amorphous silicon and which is applied to a substrate having a metal layer at least on one surface thereof and functioning as a back contact.

2. Prior Art

The formation of solar cells comprised of amorphous silicon (sometimes referred to as a-Si) on insulating, but not necessarily transparent, substrates, such as glass, ceramic, or Kapton (a trade name for a commercially available polyimide film), is particularly significant because series-interconnected solar cells can be readily fabricated on such a substrate by a simple masking technique. In order to achieve this, a metal layer with a relatively low surface resistance (approximately 50 m Ohm with a 50 cm² cell size) must first be applied to the substrate as a back contact.

It is known from the *Conference Proceedings of the Fifteenth IEEE Photovoltaic Specialists Conference*, Florida (1981) pages 922–927, especially FIG. 1, to utilize special steel discs as the substrate material in producing a-Si solar cells.

However, aluminum would be particularly well suited as a back contact material because of its high conductivity and economical price. Decisive, with production by means by high frequency sputtering, is that the crystalline size of an aluminum layer so-produced is less than about 50 nm and that the resultant layer is thermally stable because of the subsequent a-Si:H deposition, which occurs at about 250° C.

SUMMARY OF THE INVENTION

The invention provides an amorphous silicon solar cell having as a back metal layer, a stable, low-resistant aluminum layer functioning as a back contact. The crystallite size in the aluminum layer is kept as small as possible.

In accordance with the principles of the invention, a solar cell of the type earlier described is produced with the back metal layer being composed of aluminum/silicon alloy, with or without a titanium additive. In certain embodiments of the invention, the silicon component in such an alloy amounts to less than about 2%, preferably 1.3% by weight, and, with the presence of about 0.1% by weight of titanium, is about 1.2% by weight silicon. Such an aluminum/silicon back metal layer can contain about 1 to 2 percent by weight of silicon, and, when present, about 0.1 to 0.2 percent by weight titanium.

In accordance with the principles of the invention, these layers are produced by vapor-deposition or high frequency sputtering whereby the alloying components are immediately incorporated into an aluminum layer during deposition.

An indication that an aluminum/silicon, or, an aluminum/silicon/titanium alloy back metal layer does not recrystallize can be obtained from the fact that the produced layers remain bright, even during further treatment steps and exhibit a mirror-like surface. The inventive layers meet these conditions very well. In exemplary embodiments of solar cells containing a back metal layer of aluminum/silicon alloy, with or without titanium, surface resistances around 50 micro Ohm centimeters were measured with layer thicknesses ranging between about 500 through 1000 nm. The efficiencies of the resultant solar cells (having an area of 50 cm²) manufactured in this manner are about 5%.

BRIEF DESCRIPTION OF THE DRAWING

The FIGURE shows a sectional, somewhat schematic view of a solar cell (pin/ITO cell) produced in accordance with the principles of the invention.

DESCRIPTION OF THE PREFERRED EMBODIMENTS

As shown in the drawing, a substrate body 1, for example composed of glass, is provided with a back contact layer 2, for example composed of aluminum/silicon or, respectively, aluminum/silicon/titanium in a thickness of about 750 nm. That layer is RF sputtered from an Al:Si- or an Al:Si:Ti-target (diameter 8") with an RF-power of about 200 Watt using Ar at a pressure of about $10^{-2}$ mb (Millibar). The layer was deposited at a rate of about 25 nm/min onto the substrate, heated to 200° C. The resulting Aluminum-layer exhibits a mirror-like surface and is stable with respect to the subsequent heating processes during the deposition of the a-Si-layer.

Thereafter, an amorphous silicon semiconductor body 3, 4, 5 is applied to the back contact layer 2. The amorphous silicon semiconductor body, in an exemplary embodiment, is comprised of a p-doped amorphous silicon layer 3 having a thickness of about 20 nm, an intrinsic amorphous silicon layer 4 having a thickness of about 500 nm and an n-doped amorphous silicon layer 5 having a thickness of about 10 nm. Thereafter, an indium oxide-tin oxide layer (ITO, blooming) in a thickness of about 70 nm is applied and finally, a finger electrode structure 7 is deposited. As indicated hereinabove, the above solar cells can be produced by known high frequency sputtering techniques or by known vapor deposition techniques.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. In a solar cell having a semiconductor body composed essentially of amorphous silicon applied to a substrate having at least at one surface thereof comprised of a metal layer functioning as a back contact, the improvement wherein said back metal layer is composed of an aluminum-silicon alloy, with or without a titanium additive.

2. A solar cell as defined in claim 1, wherein the amount of silicon in said alloy is less than about 2% by weight.

3. A solar cell as defined in claim 2, wherein the amount of silicon in said alloy is about 1.3% by weight.

4. A solar cell as defined in claim 1, wherein said aluminum/silicon layer contains about 1 to 2% by weight silicon and contains about 0.1 through 0.2% by weight titanium.

5. A solar cell as defined in claim 1, wherein said back metal layer has a thickness in the range of about 500 through 1000 nm and has a specific resistance of about 50 micro-Ohm-cm.

6. A solar cell as defined in claim 1, wherein said back metal layer is produced by high frequency sputtering or by vapor-deposition.

* * * * *